United States Patent
Lee

(10) Patent No.: US 11,545,487 B2
(45) Date of Patent: Jan. 3, 2023

(54) THREE-DIMENSIONAL OPTOELECTRONIC DEVICE PACKAGE AND METHOD FOR MANUFACTURING THE SAME

(71) Applicant: TSLC Corporation, Miao-Li County (TW)

(72) Inventor: Po-Wei Lee, Miao-Li County (TW)

( * ) Notice: Subject to any disclaimer, the term of this patent is extended or adjusted under 35 U.S.C. 154(b) by 317 days.

(21) Appl. No.: 16/878,635

(22) Filed: May 20, 2020

(65) Prior Publication Data

US 2021/0366903 A1 Nov. 25, 2021

(51) Int. Cl.
*H01L 27/06* (2006.01)
*H01L 27/146* (2006.01)
*H01L 33/00* (2010.01)
*H01L 27/15* (2006.01)
*H01L 33/58* (2010.01)

(52) U.S. Cl.
CPC .... *H01L 27/0688* (2013.01); *H01L 27/14625* (2013.01); *H01L 27/156* (2013.01); *H01L 33/005* (2013.01); *H01L 33/58* (2013.01); *H01L 2933/0033* (2013.01)

(58) Field of Classification Search
CPC .......... H01L 27/0688; H01L 27/14625; H01L 27/156; H01L 33/005; H01L 33/58; H01L 2933/0033; H01L 33/62; H01L 25/0753
See application file for complete search history.

(56) References Cited

U.S. PATENT DOCUMENTS 6,257,771 B1 * 7/2001 Okayasu .............. G02B 6/2817
385/59

* cited by examiner

*Primary Examiner* — David Vu
(74) *Attorney, Agent, or Firm* — Jongkook Park

(57) ABSTRACT

A three-dimensional optoelectronic device package is disclosed. The three-dimensional optoelectronic device package comprises a first board having at least one surface on which a plurality of optoelectronic devices is disposed, and a second board having at least one surface on which a plurality of optoelectronic devices is disposed. A side of the second board is attached to the surface of the first board on which a plurality of optoelectronic devices is disposed to form an angle between the surface of the first board on which a plurality of optoelectronic devices is disposed and the surface of the second board on which a plurality of optoelectronic devices is disposed. A method for manufacturing a three-dimensional optoelectronic device package is also disclosed.

19 Claims, 12 Drawing Sheets

(Top View)    (Side View)

Note
D1 : Distance on X Direction
D2 : Distance on Z Direction
D3 : Center Difference on Y Direction

THREE-DIMENSIONAL OPTOELECTRONIC DEVICE PACKAGE AND METHOD FOR MANUFACTURING THE SAME

TECHNICAL FIELD

This disclosure relates generally to an optoelectronic device, and more particularly to a three-dimensional optoelectronic device package and a method for manufacturing the package.

BACKGROUND

Optoelectronic devices such as a light emitting diode (LED), a laser diode (LD), a photo diode (PD), an optical sensor, or a photo detector are used as optical transmitters or receivers for various applications.

LEDs are junction diodes made from III-V compound semiconductor material such as compound gallium arsenide phosphide, and are used a optical fiber transmitters emitting infrared radiation. Also, LEDs are cheap and convenient source of light. They are also used for data transmission.

A photodiode (PD) is a PN-junction diode that consumes light energy to produce electric current and a type of light detector that converts light into voltage or current, based on the mode of operation of the device.

A Semiconductor laser is an opto-device often referred to as laser diode or LD. In general, two types of the LD are commonly used. One is called edge emitting laser (EEL) diode and the other one is called vertical cavity surface emitting laser (VCSEL). The rectilinearity, monochromaticity, coherence, condensation, and pulse response characteristics of laser light allow it to be used in optoelectronic discs, laser printers, multi-function equipment, and more. Particularly in recent years, laser diodes have been increasingly used as light sources for measuring distant or speed of an object from the sensor and other sensing applications. Using light triangulation to measure distant requires the precise placement of the LD/LED relative to PD: distant and angle.

A typical laser sensor system has packaged or bare semiconductor laser diode and photo diode are integrated in one module; optical lens and filter are also used for directing emitting light from the module LD or LED to the object or directing the incoming/reflected light to the appropriate PD. Therefore, it is important to align these devices to each other so that accurate and precise measurement could be calculated.

A conventional optoelectronic device package comprises a circuitry substrate, optoelectronic devices, namely, LEDs, LDs, or photodiodes, etc., gold wire, and encapsulant. Conventionally, optoelectronic devices usually disposed and aligned on the substrate in two-dimensions.

For example, the light device package illustrated in FIG. 1A and FIG. 1B comprises optoelectronic devices 3 disposed on an electrically conductive substrate 5, gold wires 4 connecting the optoelectronic devices with lead electrodes on the substrate 5, and encapsulant 2 for protecting the optoelectronic devices 3 and gold wires 4. In this kind of conventional optoelectronic package, the emitting or the receiving plane of optoelectronic devices 3 are usually in parallel each other. Therefore, when an array of optoelectronic devices is disposed on a substrate, its dimension becomes long along the length of the array.

Another prior art of an optoelectronic device package, an optoelectronic sensor, is illustrated in FIG. 1C. In this kind of package, left one is a laser diode 3A packaged in TO (Transistor Outline)-CAN, in which the laser diode 3A is wired to a lead and the leads 6 are connected to the electrode of a circuit board such as PCB (Printed Circuit Board), and provided with a glass cover 7, and the right one is a die attach package such as a SMT (Surface Mount Technology) package with vertical photo-diode 3B mounted on a substrate having encapsulant 2.

This kind of optoelectronic sensor is easy to produce. However, a precise alignment is limited because of SMT (surface mount technology) process. Also, the distance and height control between discrete components of photodiodes and laser diodes in high precision is very difficult.

Another prior art of an optoelectronic device package is illustrated in FIG. 1D. As an integration package, the package includes different types of optoelectronic devices 3 which are disposed inside a cavity of a substrate 5 in vertical manner or horizontal manner on demand or request, and a glass cover 7 seals the cavity. The cavity of the substrate 5 is made by step-process, then build the 3-D circuit on vertical or horizontal surface of the substrate 5. The die attached process such as SMT to fabricate the optoelectronic device on the horizontal surface and the vertical surface together as a package is difficult and complicate. With this design, the cost and difficulty in packaging process is much higher than conventional 2D package. Low throughput manufacturing is a big issue. Also, the 3D substrate is more expensive than conventional 2D substrate. Also, the variabilities of the devices height, size and SMT process effecting the device location and height (due to solder thickness) would result in the distance and height variations between discrete components of photodiodes and laser diodes.

Generally, a process to mount and align optoelectronic devices in three-dimension is difficult and expensive due to the device mounting and wire bonding in different dimensions of surface. On the other hand, the 3D circuitry substrate is hard to make and very costly.

Thus, a solution for providing a three-dimensional optoelectronic device package in which the optoelectronic devices can be integrated for three-dimensional operation (emitting or receiving) and can be multi-function in one module with small and compact size is required.

Also, a solution for providing a three-dimensional optoelectronic device package in which a light emitting device and a light receiving device are disposed closely, and of which size is minimized with high precision alignment and low cost is required.

Also, a solution for providing a three-dimensional optoelectronic device package in which the distance and height between the optoelectronic devices can be controlled with high precision is required.

SUMMARY

An aspect of inventive concepts may provide a three-dimensional optoelectronic package of which property is innovative, compact, and high-precision alignment, in which the optoelectronic devices can be disposed in different dimension.

An aspect of inventive concepts may provide a three-dimensional optoelectronic package which is lower in cost, good for thermal management and easy for alignment with high precision.

An aspect of inventive concepts may provide a three-dimensional optoelectronic package which can be applied to an optoelectronic sensor where precision is required.

An aspect of inventive concepts may provide a three-dimensional optoelectronic package which can be applied to multi-direction emitter and receiver.

The inventive concept of the new structure of a three-dimensional electronic device package is to fabricate all the devices on the same board which is cut in two or more boards having matching alignment keys such that they could be reassembled and connected together at various angle with high precision alignment.

The inventive concept of the new structure of a three-dimensional optoelectronic device package is to assemble two or more boards having an angle between the boards with high precision alignment.

According to an aspect of the inventive concepts, a three-dimensional optoelectronic device package includes a first board having at least one surface on which a plurality of optoelectronic devices is disposed; and a second board having at least one surface on which a plurality of optoelectronic devices is disposed; wherein a side of the second board is attached to the surface of the first board on which a plurality of optoelectronic devices is disposed to form an angle between the surface of the first board on which a plurality of optoelectronic devices is disposed and the surface of the second board on which a plurality of optoelectronic devices is disposed.

Preferably, the optoelectronic devices is selected from at least one of LED, LD, PD, or sensor.

Preferably, the angle between the surface of the first board on which a plurality of optoelectronic devices is disposed and the surface of the second board on which a plurality of optoelectronic devices is disposed is substantially a right angle.

The three-dimensional optoelectronic device package can further comprises a third board having at least one surface on which a plurality of optoelectronic devices is disposed, wherein the third board is attached to the surface of the first board on which a plurality of optoelectronic devices is disposed, and the surface of the third board on which a plurality of optoelectronic devices is disposed forms substantially a right angle with the surface of the first board on which a plurality of optoelectronic devices is disposed.

Preferably, the surface of the second board on which a plurality of optoelectronic devices is disposed faces a first direction, and the surface of the third board on which a plurality of optoelectronic devices is disposed faces a second direction.

The three-dimensional optoelectronic device package can further comprise an additional alignment slot on a side of the first board to receive at least an optoelectronic component through which lights from the optoelectronic devices on the first board pass. The optoelectronic component is a lens, and the lens may be provided with a wavelength converting film and or light filter.

The three-dimensional optoelectronic device package can further comprise an encapsulant disposed at least one of the surfaces of the first board on which a plurality of optoelectronic devices is disposed and the second board on which a plurality of optoelectronic devices is disposed to protect the plurality of optoelectronic devices.

The three-dimensional optoelectronic device package also can comprise a circuit board, on which both the first board and the second board are mounted, and a heatsink.

Preferably, the first board is provided with at least an alignment recess thereof, the second board is provided with at least an alignment projection thereof contacting the surface of the first board on which a plurality of optoelectronic devices is disposed, and the alignment recess and the alignment projection fit together.

The shapes, positions and the numbers of the alignment projections of the first board and the alignment recesses of the second board can be varied as required.

Preferably, the side of the second board is adhered to the surface of the first board by soldering, gluing, or eutectic welding.

Also disclosed is a method for manufacturing a three-dimensional optoelectronic device package comprising the steps of: forming at least an alignment recess on the opposing sides of a board and a slot in the board along a line to be cut; die bonding a plurality of optoelectronic devices on at least a surface of the board; bonding wires between a plurality of optoelectronic devices and electrodes of the board; cutting the board along the slot to the end of the opposing sides of the board to separate the board into a first board on which a plurality of optoelectronic devices is disposed and an alignment recess is provided on the opposing sides thereof, and a second board on which a plurality of optoelectronic devices is disposed and an alignment projection is provided at the ends of a side thereof; assembling the first board and the second board by fitting alignment recesses and the alignment projections, and adhering the second board to the first board.

Preferably, assembling of the first board and the second board is controlled to reduce a manufacturing tolerance which is a distant variation between the designed distance (designed distance is as drawn distance when the part is designed) and the actual post assembled distance called "Actual distance" (the actual distant is the measured distance for the actually manufactured part).

Preferably, assembling of the first board and the second board is controlled such that the manufacturing tolerance of the distance between the devices of the first board and the devices of the second board in a first direction on the horizontal plane of the first board is less than 30 µm; the manufacturing tolerance of the distance between the devices of the first board and the devices of the second board on the horizontal plane of the second board is less than 30 µm; and the manufacturing tolerance of the distance between the center points of the devices of the first board and the center points of the devices of the second board in a second direction perpendicular to the first direction on the horizontal plane of the first board is less than 30 µm.

The method further comprises the step of encapsulating at least one of the surfaces of the first board on which a plurality of optoelectronic devices is disposed and the second board on which a plurality of optoelectronic devices is disposed to protect the plurality of optoelectronic devices after bonding wires.

Preferably, the method further comprises the step of attaching at least an optoelectronic component to a side of the first board after attaching the first board and the second board, through which lights from the optoelectronic devices on the first board pass.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 1A:
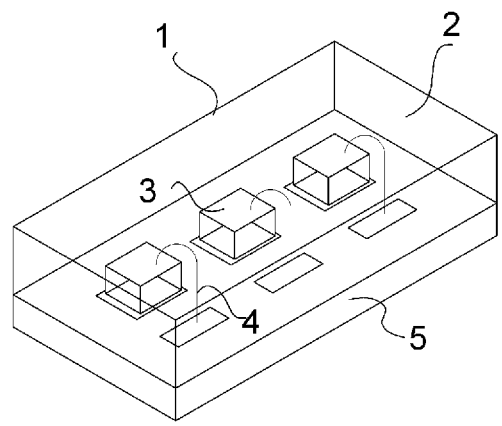
FIG. 1A is a perspective view illustrating a prior art optoelectronic device package.
Figure 1B:
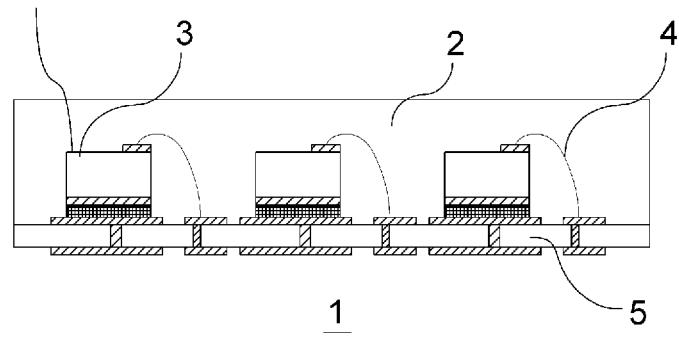
FIG. 1B is a side cross-sectional view illustrating a prior art optoelectronic device package equivalent to FIG. 1A.
Figure 1C:
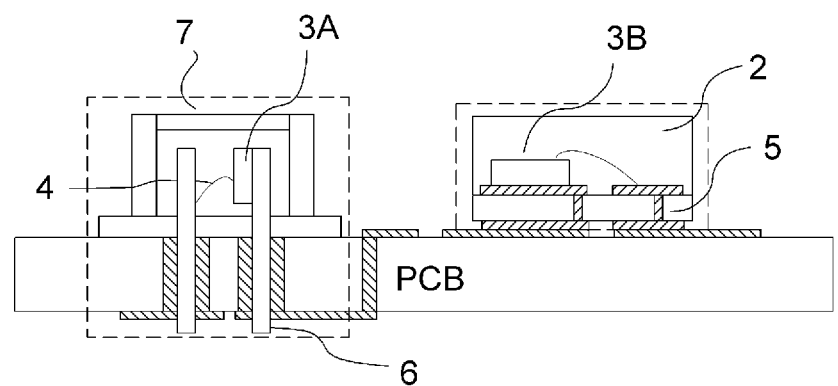
FIG. 1C is a side cross-sectional view illustrating another conventional optoelectronic device package.
Figure 1D:
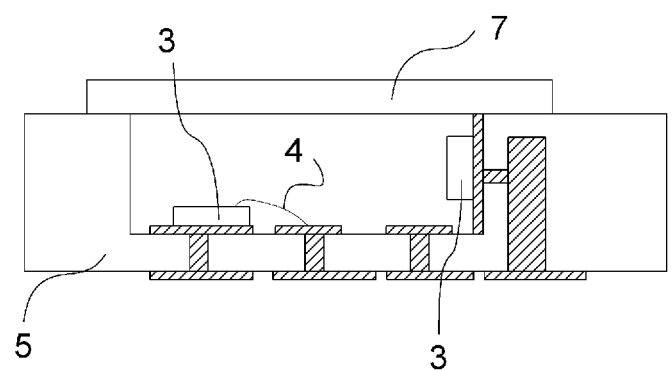
FIG. 1D is a side cross-sectional view illustrating another conventional optoelectronic device package.

In the disclosure, the terminology used is for the purpose of describing particular embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in the disclosure, specify the presence of stated features, integers, steps, operations, elements, and/or components, but do not preclude the presence or addition of one or more other features, integers, steps, operations, elements, components, and/or groups thereof.

It will be understood that, although the terms "first" and "second" may be used herein to describe various elements, components, and/or sections, these elements, components, and/or sections should not be limited by these terms. These terms are only used to distinguish one element, component, or section from another element, component or section. Thus, a first element, component, or section discussed below could be termed a second element, component, or section without departing from the teachings of inventive concepts.

Commonly used predefined terms may be construed as having the same or similar meaning as the contextual meanings of the related art and are not to be construed as an ideal or overly formal sense unless expressly defined to the contrary herein. In some cases, the terms defined herein may not be construed to exclude embodiments of the inventive concepts.

Various example embodiments in accordance with principles of inventive concepts will now be described more fully with reference to the accompanying drawings in which some embodiments are shown. Inventive concepts may, however, be embodied in different forms and should not be construed as limited to the embodiments set forth herein. Rather, these embodiments are provided so that this disclosure is thorough and complete and fully conveys inventive concepts to those skilled in the art. In the drawings, the sizes and relative sizes of layers and regions may be exaggerated for clarity.

First Embodiment

Referring to FIG. 2A, FIG. 2B, FIG. 2C, and FIG. 2D, which are illustrating the first embodiment of inventive concepts, a three-dimensional optoelectronic device package includes a first board 50A and a second board 50B.

Two boards 50A and 50B can be manufactured from one board as will be explained hereafter, and the board can be a circuit printed board such as PCB (Printed Circuit Board), ceramic board or SIC board. The material of the board could be selected from at least one of FR4, ceramic, polyimide, silicone, acrylic, epoxy, glass, and crystal. Both the first board 50A and the second board 50B have two main surfaces, and on one surface of them a plurality of optoelectronic devices 32 is disposed. In addition, the first board 50A and the second board 50B also include leads, and gold wires 40 to connect the optoelectronic devices with the leads. In addition, the boards may have other metal interconnect circuitry, other passive components, ASIC (application specific Integrated Circuit chips, GPU/CPU processors.

To protect the electronic parts on the boards 50A, 50B, encapsulants 20 can be provided, which has two functions: one is for optical ray management, the other is mechanical and environmental protection. Epoxy or silicone is commonly used material for the encapsulant. Encapsulants may be considered as one kind of sealants, however, most of them are extremely moisture resistant for use as hermetic sealing. The optoelectronic devices 31, 32 could be LED, LD, PD, or sensor etc., and for the clarity, only LD and PD are disclosed herein, however, the inventive concepts are not limited thereto.

Figure 2A:
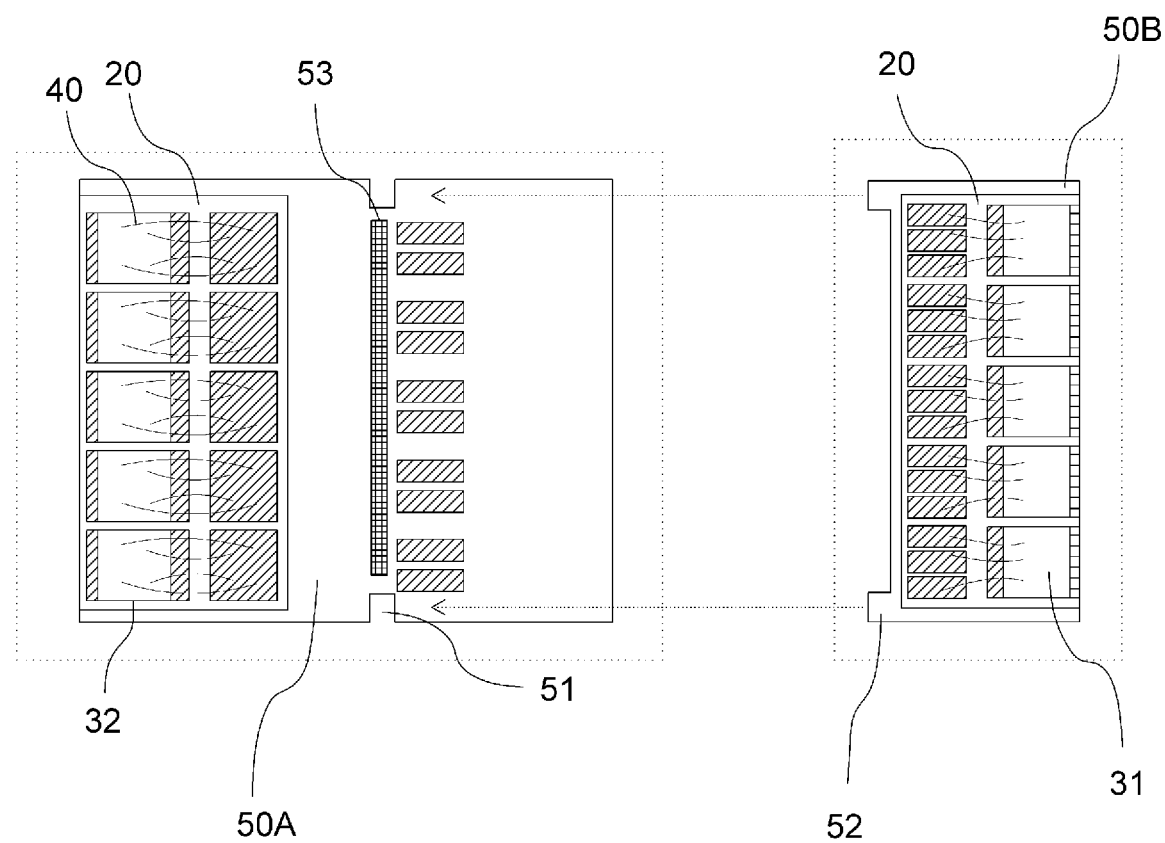
FIG. 2A is a plan view illustrating an optoelectronic device package according to the first embodiment of inventive concepts.
Figure 2B:
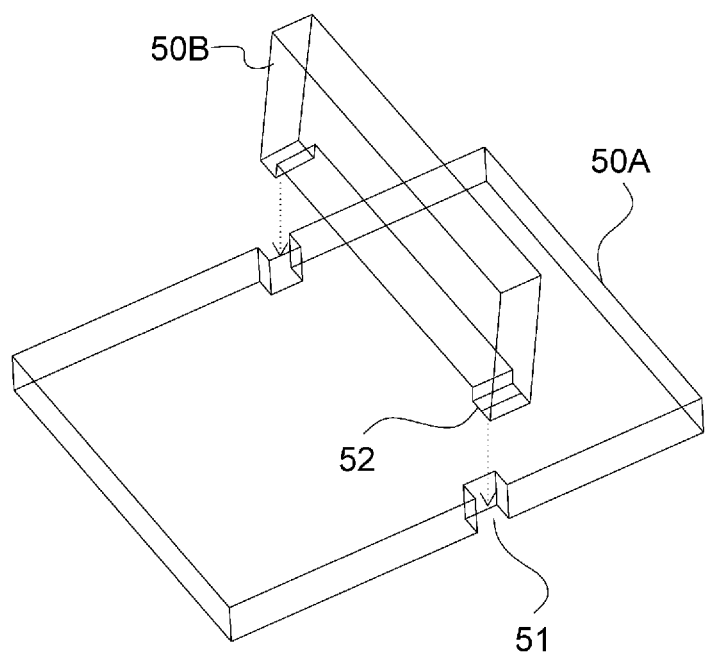
FIG. 2B is a perspective view schematically illustrating an example of connecting the first board and the second board in the optoelectronic device package according to the first embodiment of inventive concepts in FIG. 2A.
Figure 2C:
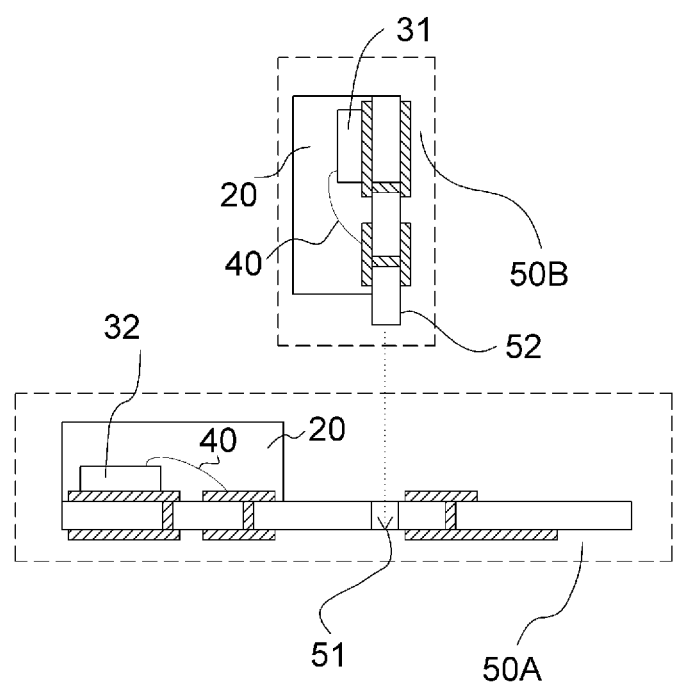
FIG. 2C is a side cross-sectional view illustrating an example of connecting the first board and the second board in the optoelectronic device package according to the first embodiment of inventive concepts in FIG. 2A.

FIG. 2B is a perspective view schematically illustrating an example for connecting the first board 50A and the second board 50B in the optoelectronic device package, and FIG. 2C is a side cross-sectional view thereof. Referring to drawings, one side of the second board 50B is attached to the surface of the first board 50A, on which a plurality of optoelectronic devices is disposed, by fitting two alignment projections 52, 52 provided at two ends of a side of the second board 50B which contacts with the surface of the first board 50A into two alignment recesses 51, 51 on the opposing sides of the first board 50A.

The alignment recesses 51, 51 in the first board 50A and the alignment projections 52, 52 in the second board 50B can be replaced with a hole-pin structure or a slot-key structure.

When the side of the second board 50B is attached to the surface of the first board 50A, glue can be applied to the area of first board 50A where two boards contact. Soldering or eutectic welding also can be applied thereto. By the assembling of two board 50A, 50B, an angle is formed between the surfaces of the first board 50A and the second board 50B on which a plurality of optoelectronic devices is disposed. There is no limit for the angle, however, preferably, the angle is substantially a right angle, thus resulting optoelectronic device package forms three-dimensional package. Since the angle does not necessarily to be a right angle, the second board can be tilted at any angle towards the first board, thereby free designing of three-dimensional package can be guaranteed.

The alignment projections 52 and the alignment recesses 51 can be formed precisely by etching or laser carving, that makes the alignment and/or positioning of the board and optoelectronic devices on the board more accurate. The shapes, positions, and the numbers of the alignment projections 52 and the alignment recesses 51 can be varied. For example, the positions of the alignment projections 52 and the alignment recesses 51 are not limited to the two ends of a side but they can be formed on any positions of the side.

Figure 2D:
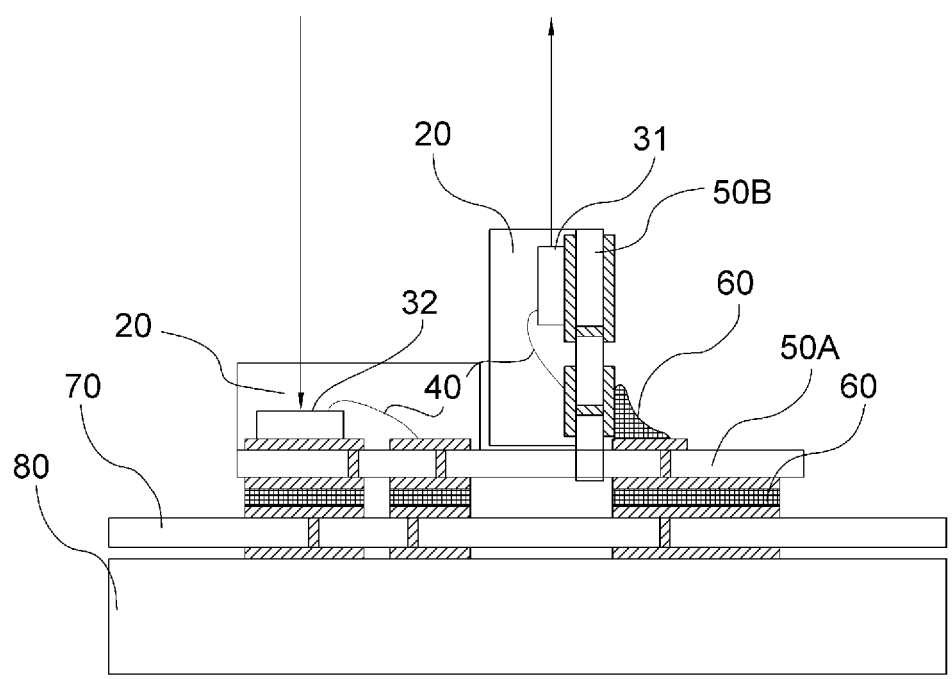
FIG. 2D is a side cross-sectional view illustrating the function or operation of the laser diode and the photo diode in the optoelectronic device package according to the first embodiment of inventive concepts in FIG. 2A.

FIG. 2D is a side cross-sectional view illustrating the function and the operation of the optoelectronic devices in the optoelectronic device package according to the first embodiment. In this embodiment, the optoelectronic devices are laser diode 31 and photo-diode 32, which constitute an optoelectronic sensor.

The optoelectronic device package in FIG. 2D further includes circuit board 70, on which both the first board 50A and the second board 50B are mounted, and below the circuit board 70, a heatsink 80 is connected to the circuit board 70 in order to control the heat of a high-power laser diode. After assembling the first board 50A and the second board 50B, the leads of the first board 50A and the second board 50B are electrically connected with soldering 60, and the soldering 60 is also applied between the package and the circuit board 70. Optoelectronic devices of the package can be electrically connected to the circuit board 70 by using a die attached process such as a surface mount technology (SMT) process. The important advantage of SMT in manufacturing includes reduced board cost, reduced material handling costs, and a controlled manufacturing process.

In this configuration, the laser diode 31 is a edge emitting laser diode having a horizontal (lateral) type mounted on the second board 50B and the photo-diode 32 is a vertical type receiving diode. A laser beam of the laser diode 31 emits to the vertical top direction, reflects by an object, and partially enters back to the photo-diode 32 to be detected. Since the disclosed package is three-dimensional, a horizontal type and a vertical type optoelectronic device can be integrated very closely in a package unlike the conventional optoelectronic device package.

Second Embodiment

Figure 3A:
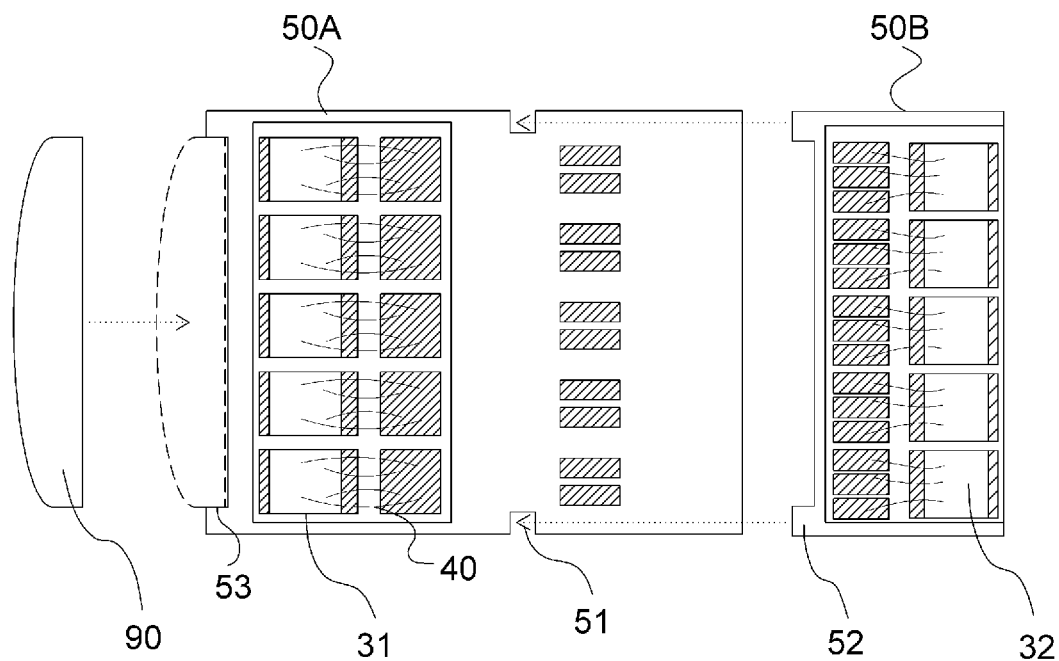
FIG. 3A is a plan view illustrating an optoelectronic device package according to the second embodiment of inventive concepts.
Figure 3B:
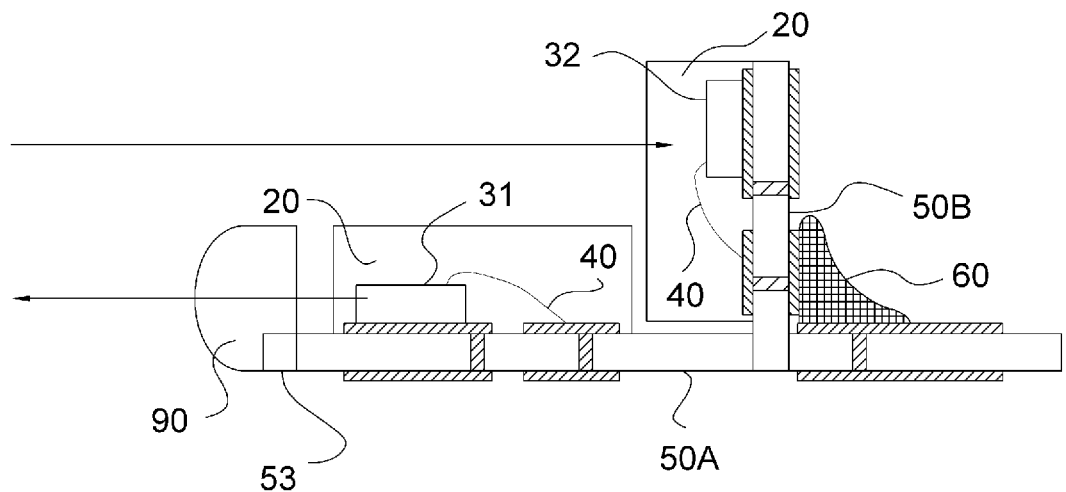
FIG. 3B is a side cross-sectional view illustrating the function and operation of the laser diode and the photo diode in the optoelectronic device package according to the second embodiment of inventive concepts in FIG. 3A.

The second embodiment of disclosed inventive concept is illustrated in FIG. 3A and FIG. 3B. The elements which constitute the optoelectronic devices package are the same to those in the first embodiment. The first difference in the second embodiment from the first embodiment is that the first board 50A further includes an additional alignment slot 53 on a side thereof to attach an optoelectronic component 90 through which light from the optoelectronic device on the first board 50A passes. The optoelectronic component equipped is a lens which has a predefined radiation angle on a laser diode in a light emitting optoelectronic device package to convert the laser beam into a parallel ray.

Optionally, the lens can include a wavelength converting film attached on the lens surface. The wavelength converting film includes a wavelength converting material for converting a wavelength of the light emitted from the laser diode. The wavelength conversion film on the lens is configured to change the wavelength range of the electromagnetic radiation emitted by the laser diode. With the wavelength range, the wavelength conversion film is configured to produce a selected light output for the laser diode.

The other difference of the second embodiment from the first embodiment is that the positional relationship of the (light emitting) laser diode 31 and the (light receiving) photo-diode. There is an opto-component 90 in the progressing path of the light emitted from the laser diode 31. The light path of the laser diode 31 is parallel to the light path of the photo-diode 32.

Optionally, the lens could be a diffusion lens to defuse the laser beam to be a multiple beam to project multiple laser beam dots to an object. The shape and the 3D information of the object could be projected by the multiple dots and detected by the detectors (photo-diodes 32). In general, a dot projector that could project multiple laser beam dots is applied for the time of fly technology and for the structure light technology.

Third Embodiment

Figures 4A, 4B:
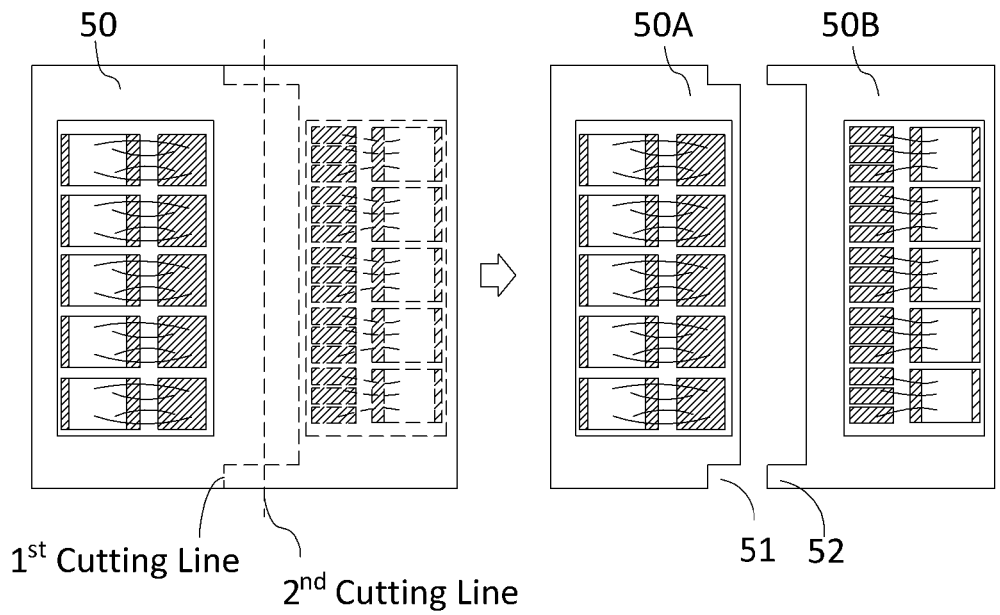
FIG. 4A is a plan view illustrating an optoelectronic device package in which the first board and the second board according to the third embodiment of inventive concepts are in a same board before cutting.
FIG. 4B is a plan view illustrating an optoelectronic device package in which the first board and the second board according to the third embodiment of inventive concepts are separated after cutting.
Figure 4C:
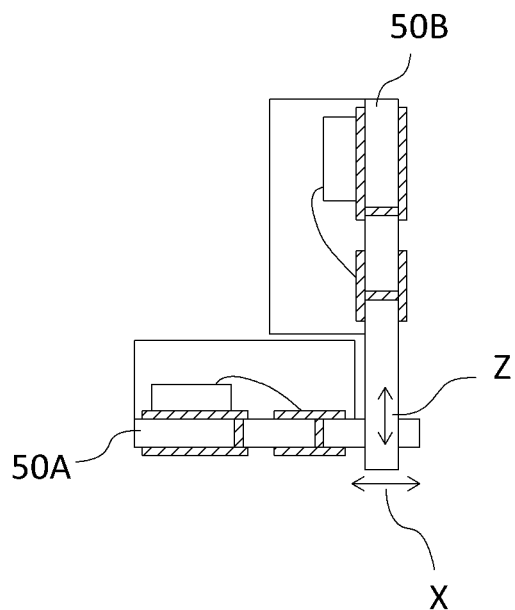
FIG. 4C is a side cross-sectional view showing that the position where the first board and the second board are assembled can be adjusted.

The third embodiment of disclosed inventive concept is illustrated in FIG. 4A, FIG. 4B. and FIG. 4C. The elements which constitute the optoelectronic devices package are the same to those in the first embodiment. The difference in the third embodiment from the first and the second embodiment is that the first board 50A and the second board 50B is from the same board 50. FIG. 4A shows the elements which constitute the optoelectronic devices package are on a board 50. A cutting/carving or etching process is performed to cut the board 50 into two boards 50A and 50B by using a same alignment key of the layout. In FIG. 4A, there are two cutting lines which divide the board 50 into two boards 50A and 50B. The cutting lines could be a laser cutting path and generate the alignment recesses 51 and the alignment projections 52 in the same cut at the same time. Since the alignment recesses 51 and the alignment projections 52 are from the same board 50, fitting of them can be performed with high precision as shown in FIG. 4B. In other words, the alignment projections 52 and the alignment recesses 51 could be formed using the same laser cut such that they have complementary shapes of 51, namely the alignment projections 52 are for male connect and the alignment recesses 51 are for female connect.

FIG. 4C shows the side view of the assembled first board 50A and second board 50B by using the male connect 52 and female connect 51; it should be noted that the connection point in the direction of Z (vertical direction) and the direction of X (horizontal direction) could be varied. This could provide an option to adjust and align the needed function of the optoelectronic devices.

Fourth Embodiment

Figures 5A, 5B:
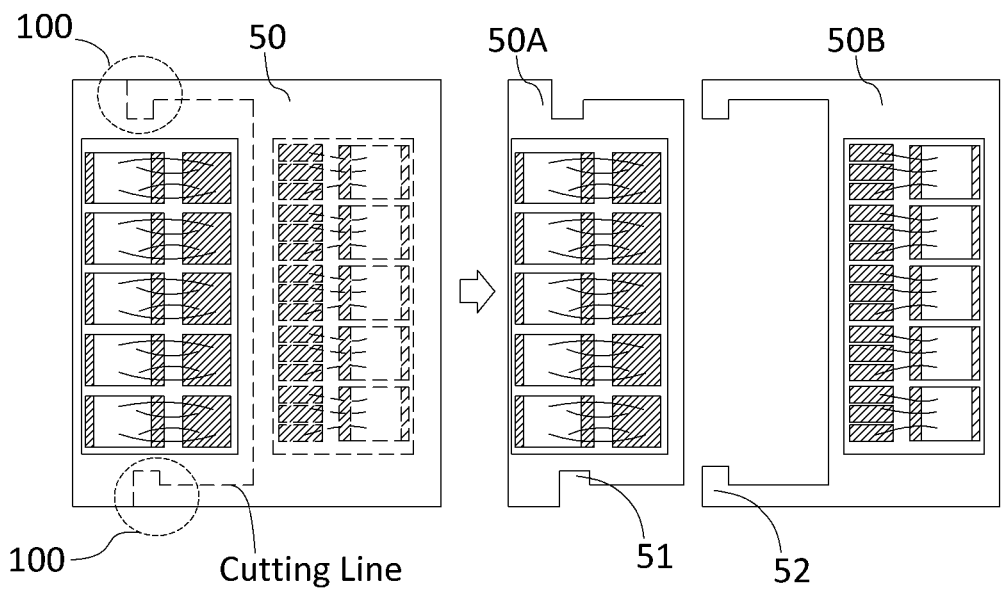
FIG. 5A is a plan view illustrating an optoelectronic device package according to the fourth embodiment of inventive concepts.
FIG. 5B is a plan view illustrating an optoelectronic device package according to the fourth embodiment of inventive concepts.
Figure 5C:
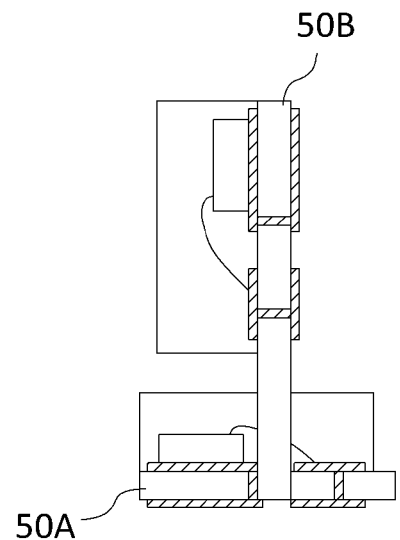
FIG. 5C is a side cross-sectional view illustrating the function and operation of the laser diode and the photo diode in the optoelectronic device package according to the fourth embodiment of inventive concepts in FIG. 4A.

The fourth embodiment of disclosed inventive concept is illustrated in FIG. 5A, FIG. 5B and FIG. 5C. The concept of the fourth embodiment is similar to the fourth embodiment. The difference in the fourth embodiment is that the cutting line is a single cutting (see FIG. 5A) having a notch cutting patterning 100 and cutting the board 50 into two boards 50A and 50B as shown in FIG. 5B. The alignment projections 52 (female connect) and the alignment recesses 51 (male connect) shown on FIG. 5B can be assembled with high precision since they were formed from the same laser cutting using the same alignment key.

FIG. 5C shows the side view of the assembled first board 50A and second board 50B by using the male connect 52 and female connect 51. The fitting could be performed with high precision because of the complementary shapes of the alignment projections 52 and the alignment recesses 51.

Fifth Embodiment

In the first and second embodiments, the optoelectronic device packages comprise only the first board 50A and the second board 50B. However, the disclosed inventive concepts are not limited to that configuration.

Figure 6:
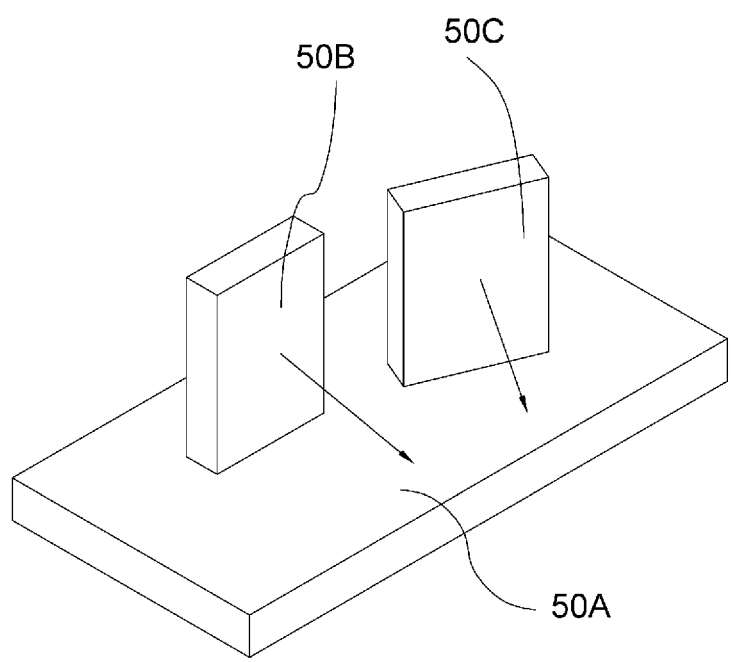
FIG. 6 is a perspective view schematically illustrating an optoelectronic device package according to the fifth embodiment of inventive concepts.

FIG. 6 is a perspective view illustrating an optoelectronic device package according to the third embodiment of inventive concepts, which further comprises an additional third board 50C having at least one surface on which a plurality of optoelectronic devices is disposed and is attached to the surface of the first board 50A at an angle therebetween. Preferably, the angle is substantially a right angle as in the first and the second embodiments.

Especially, the orientation of the third board 50C is not necessarily the same with the orientation of the second board 50B. FIG. 6 shows that the surface of the second board 50B on which a plurality of optoelectronic devices is disposed faces a first direction, and the surface of the third board 50C on which a plurality of optoelectronic devices is disposed faces different second direction, and there is no limitation between the first and the second directions unless light paths of the second board 50B and the third board 50C on the first board 50A interfere each other.

Manufacturing the Three-Dimensional Optoelectronic Package

Figure 7A:
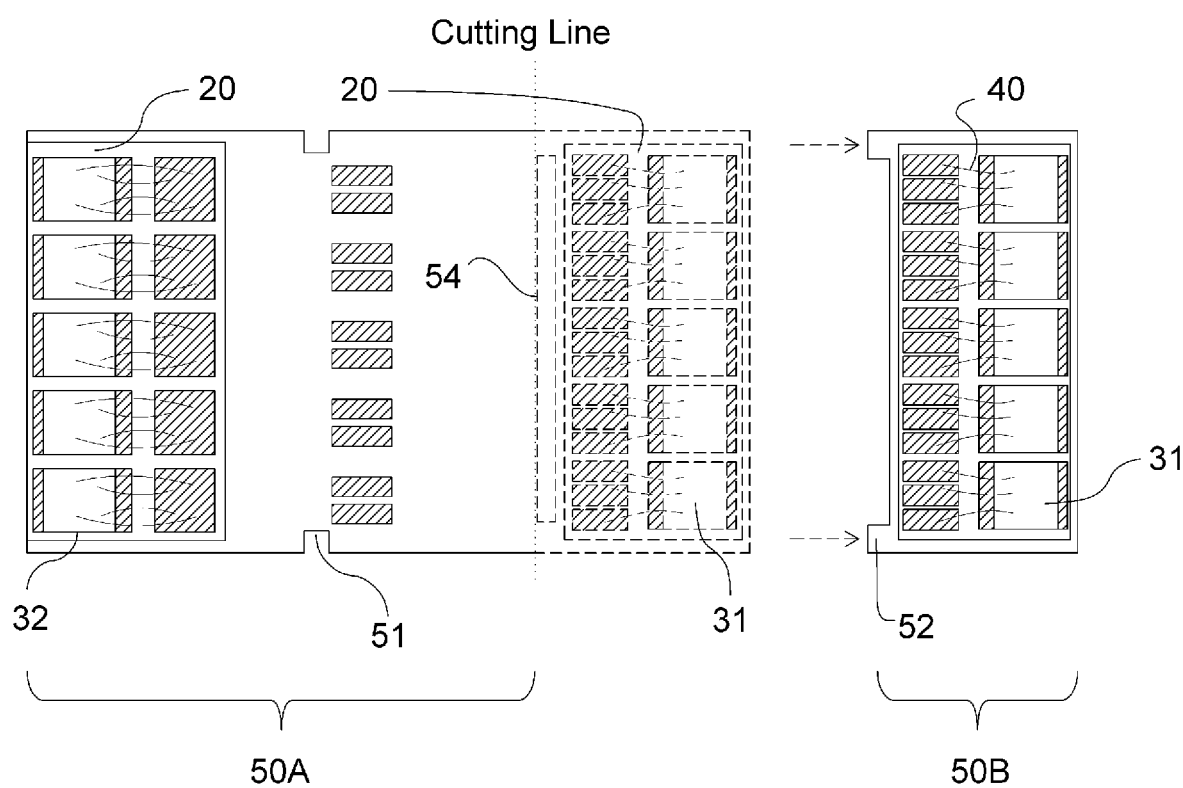
FIG. 7A is a plan view schematically illustrating a method of manufacturing the first board and the second board of the optoelectronic device package according to the first embodiment of inventive concepts.
Figure 7B:
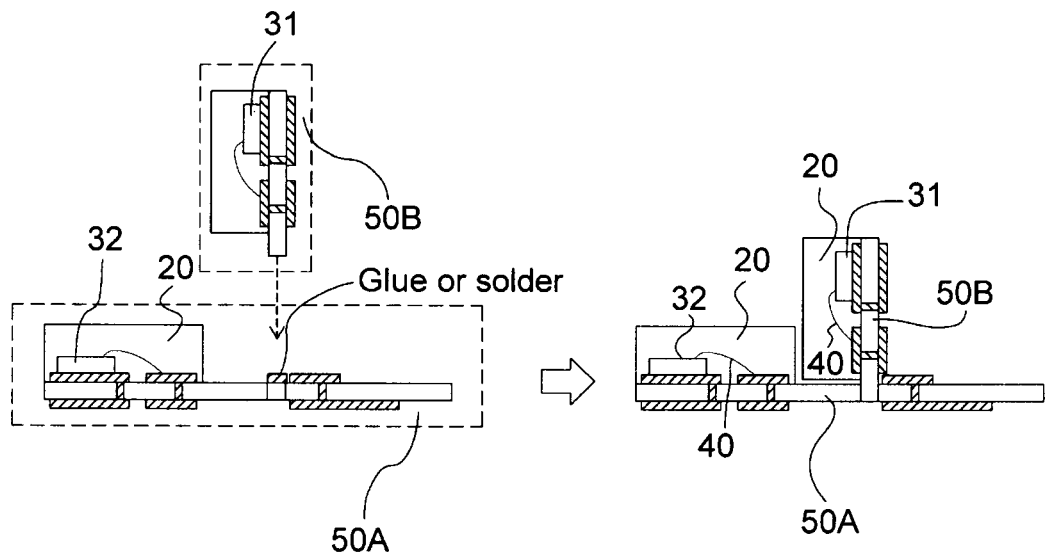
FIG. 7B is a cross-sectional view schematically illustrating a method of assembling the first board and the second board of optoelectronic device package of FIG. 7A.

Referring FIG. 7A and FIG. 7B, an example of a process for manufacturing the three-dimensional optoelectronic device package according to the inventive concepts, especially disclosed in the first embodiment, is illustrated.

As stated above, the first board 50A and the second board 50B are manufactured from one board. A substantially rectangular board is prepared, however, there is no limitation for the geometrical shapes for the board. Then, at least one alignment recess 51 is formed on the longer opposing sides of the board as well as a slot 54 along a cutting line. The recess 51 and the slot 54 are formed by laser cutting well-known to the field.

Next, a plurality of optoelectronic devices 31, 32 is mounted on at least a surface of the board using soldering, eutectic welding, or gluing, and gold wires 40 are bonded between a plurality of optoelectronic devices and electrodes of the board. After the bonding, encapsulant 20 can be provided on the board to protect the optoelectronic devices 31, 32 and wires 40. Also, a lens 90 and/or a lens on which a wavelength converting film is attached on the lens surface can be provided and is attached to the slot 53 for the optoelectronic device package according to the second embodiment.

Next, the board is cut along the slot line to the end of the opposing sides of the board to separate the board into the first board 50A on which two alignment recesses 52 are provided on the opposing sides thereof and the second board 50B having two alignment projection 52 at the ends of a side thereof.

By fitting the alignment recess 52 of the second board 50B to the alignment projections 52 of the first board 50A, the first board 50A and the second board 50B is assembled. Then, applying gluing or soldering to the area of first board 50A where two board 50A, 50B contact or applying to both the first board 50A and the second board 50B.

Figure 7C:
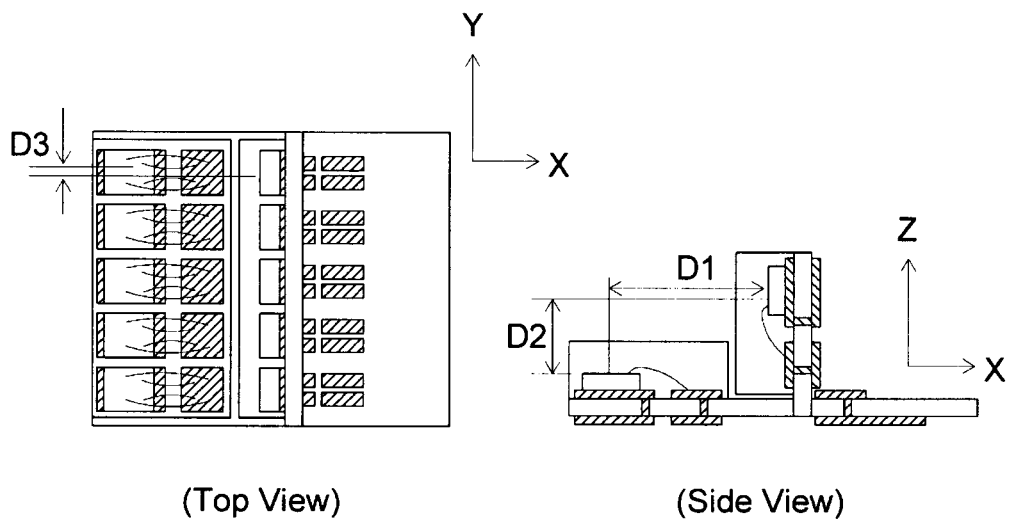
FIG. 7C is a view to explain how tolerance of the distances between the devices of the first board 50A and the devices of the second board 50B is controlled.

When assembling the first board 50A and the second board 50B, tolerance of the distances between the devices of the first board 50A and the devices of the second board 50B can be controlled. Referring FIG. 7C, X direction corresponds to the longitudinal plane of the first board 50A, Y direction is perpendicular to the X direction, and Z direction corresponds to the longitudinal plane of the second board 50B.

In another aspect, in most cases the drawn dimensions of the parts would have tolerance specification to account for the variation of the manufacturing process. It is important to design to have tolerance for minimizing the distant variation (the difference between the designed distance and the actual distant of the parts). To assemble two or more boards, the distance tolerance between the boards needs to be controlled to improve the accuracy of the optoelectronic devices' signals needed for accurate calculations. Manufacturing tolerance means a distance variation between the designed distance to the actual distance. The method according to the inventive concepts could reduce the manufacturing tolerance when assembling the actual components due to the accurate method assembling the alignment recesses 51 of the first board to the alignment projections 52 of the second board.

The manufacturing tolerance between the devices of the first board 50A and those of the second board 50B is controlled such that the distance (D1) in the X direction having the manufacturing tolerance is less than 30 µm, the distance (D2) in the Z direction having the manufacturing tolerance is less than 30 µm, and the distance (D3) between the center points of the devices of the first board 50A and the center points of the devices of the second board 50B in the Y direction having the manufacturing tolerance is less than 20 µm.

With this disclosed structure, the manufacturing tolerance between the optoelectronic devices can be controlled with high precision since the first board and the second board are aligned by fitting the boards with predetermined pair of an alignment projection and a recess. The structure of the package is mechanically strong and stable which is valuable for some application.

The alignment projections and recesses can be formed precisely by etching, stamping, punching, or laser cutting, that makes the positioning more accurate. It should be understood that the shapes and numbers of the alignment projections and recesses are not limited, and can be freely chosen in accordance with need and requirement.

Within the package, the optoelectronic devices can be integrated for three-dimensional operation (emitting or receiving) and can be multi-function in one module with small and compact size.

The embodiments disclosed herein are only provided to facilitate explanation and understanding of the disclosed technical contents, and do not limit the scope of the present disclosure.

Accordingly, the scope of the present inventive concepts should be construed as including all modifications or various other embodiments based on the inventive concepts of the disclosure.

What is claimed is:

1. A three-dimensional optoelectronic device package comprising:
    a first board having at least one surface on which a plurality of optoelectronic devices is disposed and having two or more alignment recesses; and
    a second board having at least one surface on which a plurality of optoelectronic devices is disposed and having two or more-alignment projections fitted into the alignment recesses;
    wherein a side of the second board is attached to the surface of the first board on which a plurality of optoelectronic devices is disposed to form an angle between the surface of the first board on which a plurality of optoelectronic devices is disposed and the surface of the second board on which a plurality of optoelectronic devices is disposed.

2. The three-dimensional optoelectronic device package of claim 1, the optoelectronic devices is selected from at least one of LED, LD, PD, or sensor.

3. The three-dimensional optoelectronic device package of claim 1, the angle between the surface of the first board on which a plurality of optoelectronic devices is disposed and the surface of the second board on which a plurality of optoelectronic devices is disposed is substantially a right angle.

4. The three-dimensional optoelectronic device package of claim 1, further comprising a third board having at least one surface on which a plurality of optoelectronic devices is disposed, wherein the third board is attached to the surface of the first board on which a plurality of optoelectronic devices is disposed, and the surface of the third board on which a plurality of optoelectronic devices is disposed forms substantially a right angle with the surface of the first board on which a plurality of optoelectronic devices is disposed.

5. The three-dimensional optoelectronic device package of claim 4, wherein the surface of the second board on which a plurality of optoelectronic devices is disposed faces a first direction, and the surface of the third board on which a plurality of optoelectronic devices is disposed faces a second direction.

6. The three-dimensional optoelectronic device package of claim 1, further comprising an additional alignment slot on a side of the first board to receive at least an optoelectronic component through which lights from the optoelectronic devices on the first board pass.

7. The three-dimensional optoelectronic device package of claim 6, wherein the optoelectronic component is a lens or a lens provided with a wavelength converting film.

8. The three-dimensional optoelectronic device package of claim 1, further comprising an encapsulant disposed on one of the surfaces of the first board on which a plurality of optoelectronic devices is disposed and on one of the surfaces of the second board on which a plurality of optoelectronic devices is disposed to protect the plurality of optoelectronic devices.

9. The three-dimensional optoelectronic device package of claim 1, further comprising a circuit board, on which both the first board and the second board are mounted, and a heatsink.

10. The three-dimensional optoelectronic device package of claim 1, wherein the first board is provided with at least an alignment recess thereof, the second board is provided with at least an alignment projection thereof contacting the surface of the first board on which a plurality of optoelectronic devices is disposed, and the alignment recess and the alignment projection fit together.

11. The three-dimensional optoelectronic device package of claim 1, wherein the shapes, positions, and the numbers of the alignment projections of the first board and the alignment recesses of the second board can be varied.

12. The three-dimensional optoelectronic device package of claim 11, wherein the first board and the second board are from a same board and the alignment projections of the first board and the alignment recesses of the second board are formed when the first board and the second board are separated from the same board.

13. The three-dimensional optoelectronic device package of claim 1, wherein the side of the second board is attached to the surface of the first board on which a plurality of optoelectronic devices is disposed by soldering, gluing, or eutectic welding.

14. A method for manufacturing a three-dimensional optoelectronic device package comprising the steps of:
    forming at least an alignment recess on the opposing sides of a board and a slot in the board along a line to be cut;
    die bonding a plurality of optoelectronic devices on at least a surface of the board;
    bonding wires between a plurality of optoelectronic devices and electrodes of the board;
    cutting the board along the slot to the end of the opposing sides of the board to separate the board into a first board having at least one surface on which a plurality of optoelectronic devices is disposed and an alignment recess is provided on the opposing sides thereof, and a second board having at least one surface on which a plurality of optoelectronic devices is disposed and an alignment projection is provided at the ends of a side thereof;
    assembling the first board and the second board by fitting alignment recesses and the alignment projections, and adhering the first board and the second board.

15. The method of claim 14, wherein the assembling of the first board and the second board is controlled to reduce a manufacturing tolerance which is a distance variation between the designed distance to the actual distance.

16. The method of claim 15, wherein the assembling of the first board and the second board is controlled such that the manufacturing tolerance of the distance between the devices of the first board and the devices of the second board in a first direction on the horizontal plane of the first board is less than 100 μm; the manufacturing tolerance of the distance between the devices of the first board and the devices of the second board on the horizontal plane of the second board is less than 100 μm; and the manufacturing tolerance of the distance between the center points of the devices of the first board and the center points of the devices of the second board in a second direction perpendicular to the first direction on the horizontal plane of the first board is less than 100 μm.

17. The method of claim 14, wherein adhering the second board to the first board is carried on by soldering, gluing, or eutectic welding.

18. The method of claim 14, further comprising the step of encapsulating at least one of the surfaces of the first board on which a plurality of optoelectronic devices is disposed and at least one of the surfaces of the second board on which a plurality of optoelectronic devices is disposed to protect the plurality of optoelectronic devices after the wire bonding.

19. The method of claim 14, further comprising the step of attaching at least an optoelectronic component to a slot in a side of the first board after adhering the second board to the first board, through which light from the optoelectronic devices on the first board passes.

* * * * *